United States Patent
Beauchaine et al.

(10) Patent No.: US 6,576,501 B1
(45) Date of Patent: Jun. 10, 2003

(54) DOUBLE SIDE POLISHED WAFERS HAVING EXTERNAL GETTERING SITES, AND METHOD OF PRODUCING SAME

(75) Inventors: David A. Beauchaine, Vancouver, WA (US); Timothy L. Brown, Vancouver, WA (US); Sergei V. Koveshnikov, Vancouver, WA (US); Romony San, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 10/160,146

(22) Filed: May 31, 2002

(51) Int. Cl.⁷ .................................. H01L 21/335
(52) U.S. Cl. ........................ 438/143; 438/476
(58) Field of Search ......................... 438/143, 402, 438/471, 476

(56) References Cited

U.S. PATENT DOCUMENTS

| | | | | |
|---|---|---|---|---|
| 3,929,529 A | * | 12/1975 | Poponiak | 438/476 |
| 4,053,335 A | * | 10/1977 | Hu | 438/143 |
| 4,766,086 A | * | 8/1988 | Ohshima et al. | 438/402 |
| 5,643,405 A | | 7/1997 | Bello et al. | |
| 5,721,145 A | * | 2/1998 | Kusakabe et al. | 438/476 |
| 5,998,283 A | | 12/1999 | Takamizawa et al. | |
| 6,051,498 A | | 4/2000 | Pietsch et al. | |
| 6,117,231 A | | 9/2000 | Fusegawa et al. | |
| 6,227,944 B1 | | 5/2001 | Xin et al. | |
| 6,376,335 B1 | | 4/2002 | Zhang et al. | |
| 2002/0034864 A1 | | 3/2002 | Mizushima et al. | |

* cited by examiner

Primary Examiner—Chandra Chaudhari
(74) Attorney, Agent, or Firm—Douglas G. Anderson

(57) ABSTRACT

A semiconductor wafer manufacturing process is disclosed wherein a double side polished wafer having oxygen induced stacking faults to provide extrinsic gettering on the back surface of the wafer. The process includes polishing the back surface of the wafer, and depositing a thin polysilicon film on the polished back surface. The wafer is then subjected to a thermal oxidation step, wherein the polysilicon film is consumed by the thermal oxidation step. The oxide layer is then stripped from the back surface, leaving oxygen induced stacking faults on the back surface of the wafer. The front surface of the wafer is then polished, thereby producing a double side polished wafer containing extrinsic gettering sites on the polished back surface.

18 Claims, 2 Drawing Sheets

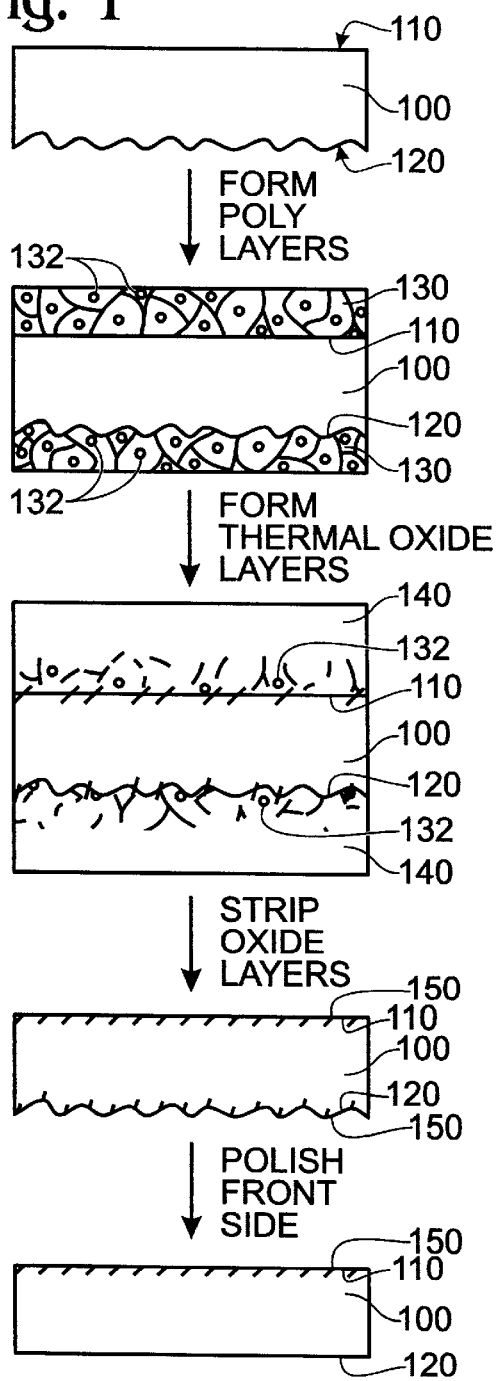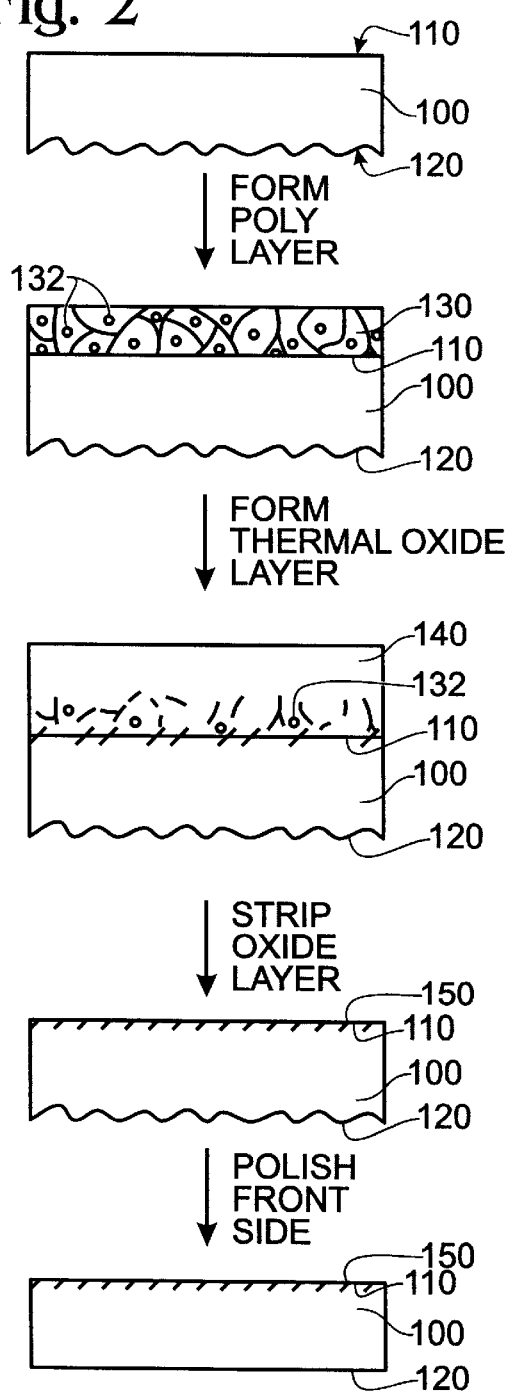

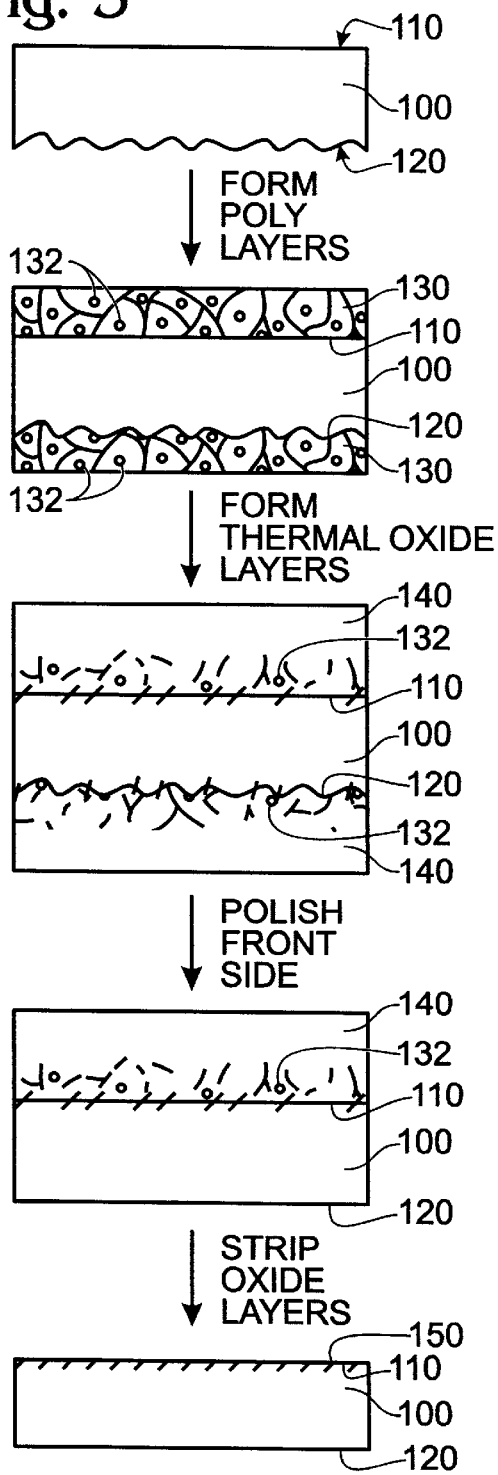
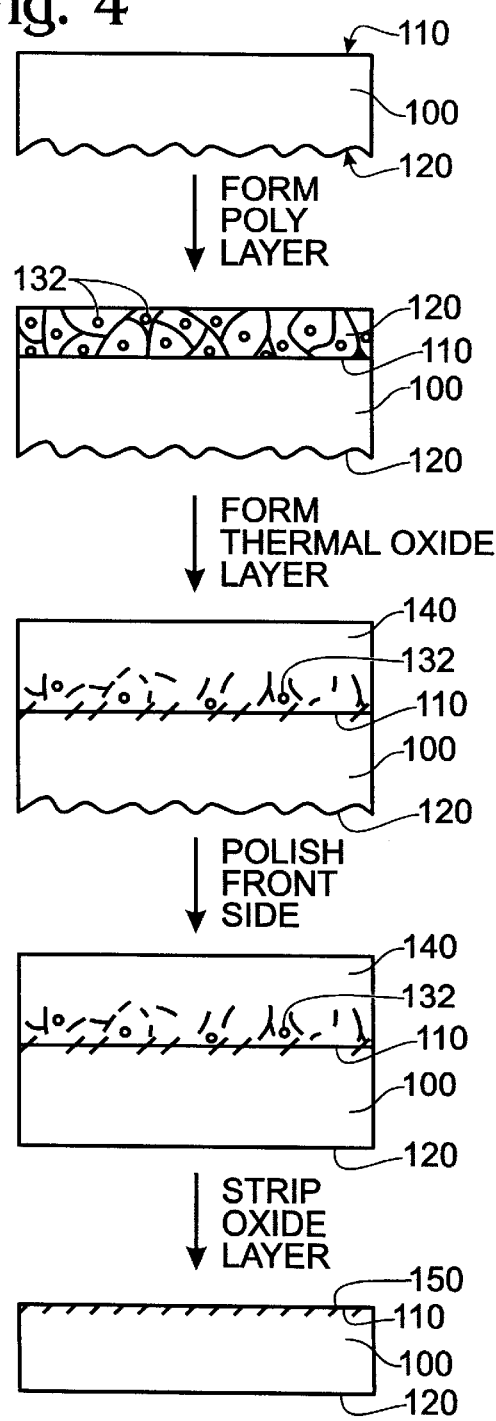

DOUBLE SIDE POLISHED WAFERS HAVING EXTERNAL GETTERING SITES, AND METHOD OF PRODUCING SAME

FIELD OF THE INVENTION

The present invention relates generally to a method of processing semiconductor wafers, and more particularly to a method of processing double side polished wafers that contain external gettering sites.

BACKGROUND OF THE INVENTION

Semiconductor integrated circuits are manufactured by combining connected circuit elements, such as transistors, diodes, resistors, and capacitors, within a continuous substrate wafer, such as a silicon wafer. Manufacturers of integrated circuits are continually trying to improve performance and reduce the size of semiconductors in order to reduce cost of manufacture, with line widths reaching 0.13 microns or smaller. This improvement naturally requires improvements in the quality of the wafers used as the substrate for such circuitry. Some of the factors that impact the ability to reduce the size of the integrated circuit include flatness of the substrate wafer and contamination levels both within the wafer bulk and on the surfaces of the wafer.

Semiconductor wafers are manufactured typically by growing a monocrystalline ingot using Float Zone, Ribbon Growth, or more commonly, a Czochralski technique. The ingot is then sliced into individual wafers using an inner diameter saw where wafers are sliced individually from the ingot, or a wire saw wherein the entire ingot is sliced into wafers simultaneously. The wafers are then subjected to an edge profiling process to round the edges and remove stress points. A wafer thinning step is then employed, such as lapping or surface grinding, to both remove slicing damage from the surfaces of the wafer and to make the opposing surfaces as flat and coplanar as possible. Because much of the equipment used to slice and shape the surfaces of the wafer are metal, and because metallic contaminants negatively effect the quality of an integrated circuit, the wafer is then subjected to a chemical etching, which removes metal ions from the surfaces of the wafer and assists in removing the finer surface damage caused by the lapping or surface grinding steps. Historically, one side of the wafer has then been polished to a mirror-like finish to provide a smooth surface for manufacture of the integrated circuit. This surface that will be used for manufacture of the integrated circuit is typically called the "front side" of the wafer, with the opposing side being called the "back side" of the wafer.

Because small amounts of metallic impurities are grown into the crystal originally, an extrinsic gettering method has often been used on the back side of the wafer to gather and trap these metallic impurities. This extrinsic gettering has typically been accomplished by introducing small amounts of damage to the back side of the wafer by various techniques such as a wet sand blast. The wafer is then heat treated to allow the metallic impurities to diffuse through the wafer bulk to the damaged area on the back side of the wafer, where the impurities gather and are trapped. Another common technique for this extrinsic gettering is to deposit a thin polycrystalline film on the back of the wafer by chemical vapor deposition (CVD), which is performed at elevated temperatures, and assists the impurities in diffusing through the wafer bulk to the grain boundaries of the polycrystalline silicon, where they are gettered and trapped. Unfortunately, since there is damage on the back side of the wafer, the damage also acts as a trap for particles and other contaminants in the ambient surroundings of the wafer. These particles may become dislodged at inopportune times, and cause failure or decreased yield in the manufacture of the integrated circuit.

One of the methods utilized to improve flatness of the substrate wafer and simultaneously improve the surface contamination levels is polishing both sides of the substrate wafer, know as double side polishing, or DSP. DSP can be performed by polishing both sides of the wafer simultaneously, or by polishing one side at a time. However, a wafer polished on both sides loses extrinsic gettering capabilities. As such, efforts have been made to perform partial backside polish, where some of the damage, or surface roughness, is removed. This offers some extrinsic gettering abilities, but sacrifices some of the benefits associated with double side polishing in that particles can still be trapped in the surface roughness. Conversely, if both sides of the substrate wafer are polished to a complete polish, sometimes known as a "mirror polish", the surface roughness on both sides is reduced to a few Angstroms or less. This complete polished surface is fine enough to prevent particle trapping, but is so fine that little or no extrinsic gettering is available.

Therefore, a need exists for a double side polished wafer where a complete polish is possible on both sides of the wafer, with the wafer still having extrinsic gettering capabilities.

SUMMARY OF THE INVENTION

The present invention relates to a semiconductor substrate wafer which has been polished on both sides to a complete or mirror polish but provides extrinsic gettering on the back side of the wafer, and a method for manufacturing such a wafer. In the present invention, a semiconductor substrate wafer is prepared by slicing an ingot into wafers. This slicing can be accomplished by either an inner-diameter saw where wafers are sliced sequentially, or by a wire saw, wherein the entire ingot is sliced into multiple wafers simultaneously. The wafer is then subjected to an edge grinding process, where the periphery of the wafer is chamfered to increase strength and remove sharp edges that can easily be chipped or broken. Lapping or surface grinding both surfaces of the wafer to remove slicing damage and to make the front and back surfaces both flat and parallel to each other is next performed on the wafer. After lapping or surface grinding, the wafer is chemically etched. Common etchants can be either an acid mixture, such as a mixture of Nitric, Acetic, and Hydroflouric acids, or a caustic mixture, such as Sodium Hydroxide. A sequential etch where -first one solution and then the other solution is utilized may also be employed. Etching is performed to remove the damage caused by lapping or surface grinding, to remove metals contamination, and to improve brightness on the wafer surfaces. A wafer identification process, such as a laser marking process, may be employed if desired, said process being inserted either immediately before or after the lapping or surface grinding process.

The back side of the wafer is then polished to a complete, or mirror polish. In this case, a complete or mirror polish on the back side of the wafer as a polish that is no more than 2 times the surface roughness or other measurement characteristics as that of the polished front side. For example, if the front side of the wafer is polished to a surface roughness of 5 Å, the back side would have a surface roughness of no more than 10 Å.

After the back side of the wafer is polished, a thin polysilicon layer is deposited on the wafer, and the wafer is then subjected to an oxidation step. The oxidation step consumes the polysilicon layer and forms stacking faults at the back surface of the wafer. Once the stacking faults are formed, the oxide layer is then stripped from both sides of the wafer, and the front side of the wafer is subjected to a complete polish. This process is useful for all wafer diameters.

BRIEF DESCRIPTION OF THE DRAWINGS

FIG. 1 depicts a process flow of one embodiment of the present invention wherein stacking faults are formed on both sides of the wafer.

FIG. 2 depicts a process flow of another embodiment of the present invention wherein stacking faults are formed only on the back side of the wafer.

FIG. 3 depicts a modified process flow of the embodiment found in FIG. 1.

FIG. 4 depicts a modified process flow of the embodiment found in FIG. 2.

DETAILED DESCRIPTION OF THE INVENTION

The present invention will now be described more fully hereinafter, in which preferred embodiments of the invention are shown. This invention may, however, be embodied in many different forms and should not be construed as limited to the embodiments set forth herein. These embodiments are provided so that the disclosure will convey the scope of the invention to those skilled in the art.

Turning now to FIG. 1, a semiconductor wafer, such as a silicon wafer, is prepared through standard wafer shaping techniques including slicing the wafer from a crystal ingot, chamfering the periphery of the wafer, lapping or surface grinding the front and back surfaces, chemically etching the surfaces, and polishing the back surface of the wafer to a complete or mirror polish. Multiple cleaning steps, optional identification marking steps, and/or inspection steps may be performed as desired. A wafer thus prepared is depicted as 100 on FIG. 1, containing a polished back side 110 and an unpolished front side 120.

Wafer 100 is then subjected to a process to grow a polysilicon layer 130 on both the polished back side 110 and the unpolished front side 120. During growth of the polysilicon layer 130, high levels of oxygen 132 will be trapped in the grains of the polysilicon layer 130. The polysilicon layer 130 can be in the thickness range of about 50 Å to about 500 Å, and can be grown using any known method of chemical vapor deposition (CVD), including hot-wall and cold-wall reactors, atmospheric pressure (APCVD) or low pressure (LPCVD), and in single wafer reactors or in batch reactors.

Wafer 100 is then subjected to a thermal oxidation step wherein an oxide layer 140 is deposited on the surfaces of the polysilicon layer 130. The oxide layer can be in the thickness range of 100 Å to 100 Å. The limiting factor is the ability for the oxide layer 140 to be able to completely "consume" the polysilicon layer 130 such that when the oxide layer 140 is later stripped from the surface of the wafer 100, oxygen induced stacking faults (OISF or OSF) 150 remain on the surface of the wafer, but no polysilicon layer 130 exists. A typical thermal oxidation cycle sufficient for the purpose of consuming the polysilicon layer 130 can range from about 850° C. to 1000° C., with a duration of approximately 30 minutes. As is known in the art, varying temperature and time settings result in varied oxide layer thicknesses and can be optimized accordingly.

After the thermal cycle for the oxide layer 140 is complete, the wafer is subjected to a stripping and cleaning process. A typical stripping and cleaning process utilizes a hydrofluoric acid (HF) bath, followed by the so-called RCA cleaning, which comprises a first bath containing a mixture of water, hydrogen peroxide, and ammonium hydroxide (also known as SC1) followed by a bath containing a mixture of water, hydrogen peroxide, and hydrochloric acid (also known as SC2). The HF bath strips the oxide layer 140 from the wafer, the SC1 bath removes organic contaminants as well as some Group I and Group II metals, and SC2 removes alkali and transition metals.

When the oxide layer 140 is stripped from the wafer, and since the polysilicon layer 130 was consumed by the oxide layer 140, the back side surface 110 and the front side surface 120 of wafer 100 contain stacking faults 150 with a density of up to $3*10^5$ cm$^{-2}$. These stacking faults act as extrinsic gettering sites, where impurities found within the wafer will migrate and be trapped.

The front side 120 of wafer 100 is then subjected to a complete polishing process, which removes the stacking faults 150 from the front side 120. The surface roughness of the front side 120 and the back side 110 are comparable, with both sides having a roughness of about 10 Å or less, yet the back side 110 contains sufficient stacking faults 150 to provide extrinsic gettering.

FIG. 2 demonstrates another embodiment, wherein processing steps are completed in the same fashion as that of the embodiment depicted in FIG. 1. As shown in FIG. 2, however, the polysilicon layer 130 is deposited only on the back side 110 of the wafer 100. This alternate embodiment can utilize single-side wafer CVD chambers and/or single wafer processing chambers. Since there is no benefit in gettering or processing by having oxygen induced stacking faults on the front surface of the wafer, where they would ultimately need to be removed by polishing, the embodiment of FIG. 2 allows for providing extrinsic gettering capability on the back side of the wafer without any processing of the front side.

As shown if FIG. 3, another embodiment of the present invention provides for forming a polysilicon layer 230 on both the back side 210 and front side 220 of wafer 200, wherein the back side 210 has previously been subjected to a complete or mirror polish. The polysilicon layer 230 has interstitial oxygen through the layer. Thermally induced oxide layers 240 are then grown on both polysilicon layers 230, wherein the polysilicon layers 230 are consumed by the oxide layers 240. The oxygen originally contained in the polysilicon layers 230 migrates to the wafer surfaces 210 and 220, and forms oxygen induced stacking faults, 250. The front side 220 of the wafer 200 is then subjected to a complete or mirror polish process, wherein the oxide layer 240 is polished off the front side 220, the stacking faults 250 are polished off, and then the front surface 220 itself is complete or mirror polished. The back side of the wafer 210 still contains the oxide layer 240. After the complete polish step is completed on the front surface 220, the wafer is then subjected to a strip and clean process wherein HF is used to strip the oxide layer from the back side, and an RCA cleaning is then used to clean the wafer surfaces 210 and 220. The resultant wafer has a completely polished back side surface 210 that contains stacking faults 250 to supply extrinsic gettering, and a front surface 220 with a complete polish. The surface roughnesses of both the back surface 210 and the front surface 220 are approximately 10 Å or less. The disadvantage of this embodiment is the added time required to polish away the oxide layer 240, and obviously the thinner the oxide layer 240 is, the faster the polishing process. The advantage of this embodiment, however, is the back surface 220 is protected by the oxide layer 240 from any additional impurities that may be found within the polishing process, ultimately resulting in a cleaner wafer 200.

In yet another embodiment, as depicted in FIG. 4, a complete or mirror polished back side 210 of a wafer 200 is subjected to a process for growing a polysilicon layer 230, again such layer containing oxygen. A thermally grown oxide layer 240 is then grown on the polysilicon layer 230. The front side 220 of the wafer 200 is not subjected to either the process for growing polysilicon or an oxide layer. At this point, the front surface 220 of the wafer 200 is subjected to a complete or mirror polish. The wafer 200 is then subjected to a stripping and cleaning process wherein HF is used to strip the oxide layer 240 off the back surface 210, leaving stacking faults 250 on the back surface 210. The wafer cleaning is continued in typical fashion using RCA. The resultant wafer 200 contains a complete or mirror polish on both back and front surfaces 210 and 220, having surface roughnesses of 10 Å or less, and with the back surface 210 having extrinsic gettering capabilities in the form of oxygen induced stacking faults 250 in a density of up to $3*10^5$ cm$^{-2}$.

Various changes could be made to any or all of the above described embodiments of the present invention while still encapsulating the inventive scope of the invention. The embodiments provided show examples of processes for achieving double side polished wafer wherein the back side of the wafer contains extrinsic gettering, and the invention is not meant to be limited by such embodiments. As such, those skilled in the art can carry out modifications and changes to the specifically described embodiments without departing from the scope or spirit of the present invention, which is inteded to be limited only the by the scope of the appended claims.

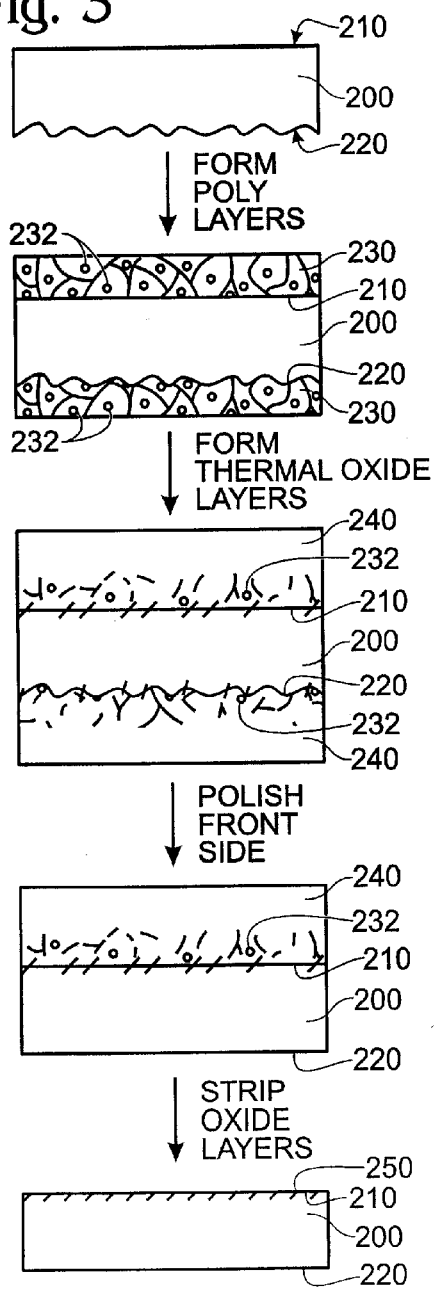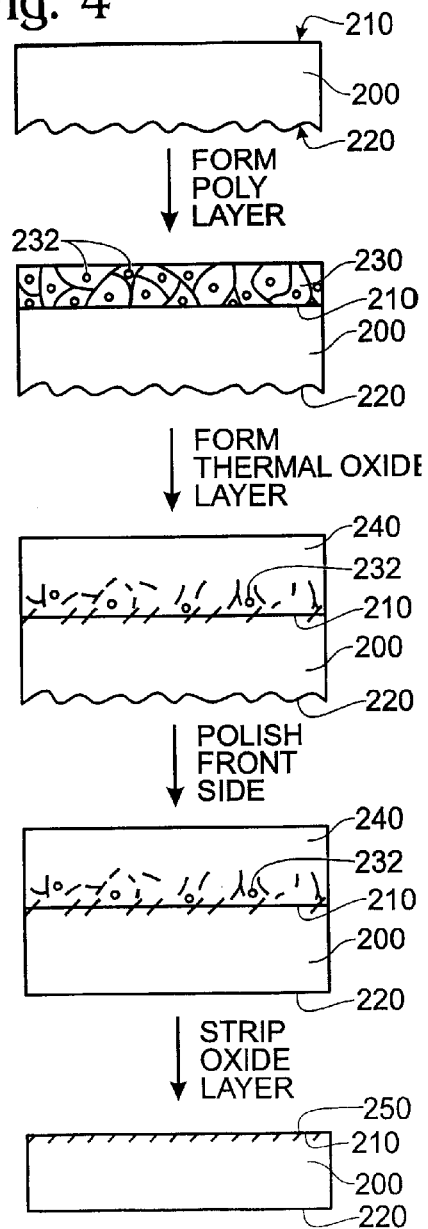

What is claimed is:

1. A method of producing a double-side polished wafer containing extrinsic gettering sites on one side, comprising:
   providing a semiconductor wafer, said wafer having a front surface and a back surface, wherein the back surface has been polished;
   forming a polysilicon layer on the front surface and the back surface, said polysilicon layers containing oxygen;
   forming a thermal oxide layer on each of the polysilicon layers, wherein the oxide layers consume the polysilicon layers;
   stripping the thermal oxide layers off of the wafer; and
   polishing the front side of the wafer.

2. The method of claim 1, wherein the back surface contains oxygen induced stacking faults to serve as extrinsic gettering sites.

3. The method of claim 2 wherein the back surface contains at least $5*10^4$ oxygen induced stacking faults per square centimeter.

4. The method of claim 1, wherein the polysilicon layers are between 50 Å and 500 Å in thickness.

5. The method of claim 4, wherein the polysilicon layers are deposited by chemical vapor deposition.

6. The method of claim 5 wherein the polysilicon layers are deposited by low pressure chemical vapor deposition.

7. The method of claim 1, wherein the thermal oxide layers are between 100 Å and 1000 Å in thickness.

8. The method of claim 1 wherein the thermal oxide layers are formed at a temperature of between 850° C. and 1000° C.

9. The method of claim 1, wherein each of the back and front surfaces have a surface roughness of below 10 Å after polishing the front side of the wafer.

10. A method of producing a double-side polished wafer containing extrinsic gettering sites on one side, comprising:
    providing a semiconductor wafer, said wafer having a front surface and a back surface, wherein the back surface has been polished;
    forming a polysilicon layer on the front surface and the back surface, said polysilicon layers containing oxygen;
    forming a thermal oxide layer on each of the polysilicon layers, wherein the oxide layers consume the polysilicon layers;
    polishing the front side of the wafer; and
    stripping the thermal oxide layer off of the back surface of the wafer.

11. The method of claim 10, wherein the back surface contains oxygen induced stacking faults to serve as extrinsic gettering sites.

12. The method of claim 11, wherein the back surface contains at least $5*10^4$ oxygen induced stacking faults per square centimeter.

13. The method of claim 10, wherein the polysilicon layers are between 50 Å and 500 Å in thickness.

14. The method of claim 13, wherein the polysilicon layers are deposited by chemical vapor deposition.

15. The method of claim 14, wherein the chemical vapor deposition process is a low pressure chemical vapor deposition.

16. The method of claim 10, wherein the thermal oxide layers are between 100 Å and 1000 Å in thickness.

17. The method of claim 10, wherein the thermal oxide layers are formed at a temperature of between 850° C. and 1000° C.

18. The method of claim 10, wherein each of the back and front surfaces have a surface roughness of below 10 Å after polishing the front side of the wafer.

* * * * *

UNITED STATES PATENT AND TRADEMARK OFFICE
CERTIFICATE OF CORRECTION

PATENT NO. : 6,576,501 B1
DATED : June 10, 2003
INVENTOR(S) : Beauchaine et al.

It is certified that error appears in the above-identified patent and that said Letters Patent is hereby corrected as shown below:

Drawing sheet, consisting of Figs. 3-4, should be deleted to be replaced with the drawing sheet, consisting of Figs. 3-4, as shown on the attached page.

Signed and Sealed this

Second Day of March, 2004

JON W. DUDAS
*Acting Director of the United States Patent and Trademark Office*